(12) United States Patent
Freeman et al.

(10) Patent No.: US 8,017,483 B2
(45) Date of Patent: Sep. 13, 2011

(54) METHOD OF CREATING ASYMMETRIC FIELD-EFFECT-TRANSISTORS

(75) Inventors: Gregory G. Freeman, Hopewell Junction, NY (US); Shreesh Narasimha, Hopewell Junction, NY (US); Ning Su, Hopewell Junction, NY (US); Hasan M. Nayfeh, Hopewell Junction, NY (US); Nivo Rovedo, Hopewell Junction, NY (US); Werner A. Rausch, Hopewell Junction, NY (US); Jian Yu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 187 days.

(21) Appl. No.: 12/493,549

(22) Filed: Jun. 29, 2009

(65) Prior Publication Data
US 2010/0330763 A1 Dec. 30, 2010

(51) Int. Cl.
*H01L 21/336* (2006.01)
(52) U.S. Cl. ............ 438/286; 438/525; 257/E21.345; 257/E21.618
(58) Field of Classification Search .......... 438/286, 438/525, 950; 257/E21.618
See application file for complete search history.

(56) References Cited

U.S. PATENT DOCUMENTS

| | | | |
|---|---|---|---|
| 6,025,224 A | 2/2000 | Gall et al. | |
| 6,083,794 A | 7/2000 | Hook et al. | |
| 6,242,329 B1 | 6/2001 | Huster et al. | |
| 6,271,565 B1 | 8/2001 | Hook et al. | |
| 6,339,005 B1 | 1/2002 | Bryant et al. | |
| 6,479,868 B1 | 11/2002 | An et al. | |
| 6,489,223 B1 | 12/2002 | Hook et al. | |
| 6,576,513 B2 * | 6/2003 | Yim et al. | 438/257 |
| 6,756,637 B2 | 6/2004 | Adkisson et al. | |
| 7,183,573 B2 | 2/2007 | Bryant et al. | |
| 7,279,387 B2 | 10/2007 | Chen et al. | |

(Continued)

OTHER PUBLICATIONS

2. Implementation and optimization of asymmetric transistors in advanced SOI CMOS technologies for high performance microprocessors Hoentschel, J.; Wei, A.; Wiatr, M.; Gehring, A.; Scheiper, T.; Mulfinger, R.; Feudel, T.; Lingner, T.; Poock, A.; Muehle, S.; Krueger, C.; Herrmann, T.; Klix, W.; Stenzel, R.; Stephan, R.; Huebler, P.; Kammler, T.; Shi, P.; Raab, M.; Greenlaw, D.; Horstmann, M.; (2008).

(Continued)

*Primary Examiner* — Chandra Chaudhari
(74) *Attorney, Agent, or Firm* — Yuanmin Cai

(57) ABSTRACT

The present invention provides a method of forming asymmetric field-effect-transistors. The method includes forming at least a first and a second gate-mask stack on top of a semiconductor substrate, wherein the first and second gate-mask stacks include at least, respectively, a first and a second gate conductor of a first and a second transistor and have, respectively, a top surface, a first side, and a second side with the second side being opposite to the first side; performing a first halo implantation from the first side of the first and second gate-mask stacks at a first angle while applying the first gate-mask stack in preventing the first halo implantation from reaching a first source/drain region of the second transistor, wherein the first angle is equal to or larger than a predetermined value; and performing a second halo implantation from the second side of the first and second gate-mask stacks at a second angle, thereby creating halo implant in a second source/drain region of the second transistor, wherein the first and second angles are measured against a normal to the substrate.

26 Claims, 15 Drawing Sheets

U.S. PATENT DOCUMENTS 7,449,386 B2 * 11/2008 Lin et al. .................. 438/302

OTHER PUBLICATIONS

45nm SOI CMOS Technology with 3X hole mobility enhancement and Asymmetric transistor for high performance CPU application Fung, S.K.H.; Lo, H.C.; Cheng, C.F.; Lu, W.Y.; Wu, K.C.; Chen, K.H.; Lee, D.H.; Liu, Y.H.; Wu, I.L.; Li, C.T.; Wu, C.H.; Hsiao, F.L.; Chen, T.L.; Lien, W.Y.; Huang, C.H.; Wang, P.W.; Chiu, Y.H.; Lin, L.T.; Chen, K.Y.; Tao, H.J.; Tuan, H.C.; Mii, Y.J.; Sun, Y.C.; (2007).

1. A new Self-Aligned Asymmetric Structure (SAAS) for 0.1 μm MOSFET technology Chang-Soon Choi; Kyung-Whan Kim; Woo-Young Choi; Electron Devices Meeting, 2000. Proceedings. 2000 IEEE Hong Kong Jun. 24, 2000 pp. 60-63 Digital Object Identifier 10.1109/HKEDM.2000.904216.

* cited by examiner

METHOD OF CREATING ASYMMETRIC FIELD-EFFECT-TRANSISTORS

FIELD OF THE INVENTION

The present invention relates generally to the field of semiconductor device manufacturing, and in particular relates to a method of manufacturing asymmetric field-effect-transistors by applying hard mask shadowing.

BACKGROUND OF THE INVENTION

With recent advancement of semiconductor integrated circuitry (IC) technologies, electronic devices and/or products have been able to achieve lower power consumption and higher performance provided by the various integrated circuits that the electronic devices and/or products are made from. Generally, power consumption and performance of the various integrated circuits stem from/or are dependent upon capacitance, resistance, and leakage current of the components (electrical junctions, wires, dielectrics, etc) that the integrated circuits may contain, and operational current of the various transistors such as field-effect transistors (FETs) that the integrated circuits may include as well.

With shrinking dimensions of various integrated circuit components, transistors such as FETs have experienced dramatic improved performance over time. This improvement has been largely attributed to the reduced dimensions of components used therein, which generally translate into reduced capacitance and increased current for the transistors. Nevertheless, performance improvement brought up by this type of "classic" scaling, in device dimensions, has recently met obstacles and even been challenged, when the scaling goes beyond a certain point, by an increased leakage current and variability that are inevitably associated with this continued reduction in device dimensions.

So far, substantial efforts have been devoted to modify existing properties of transistors such FETs in order to improve power consumption and performance of the integrated circuit built from such transistors. As is generally known in the art, an FET usually contains various components including, for example, a deep diffusion region of source/drain and a shallower extension region that links a gate of the FET to the deep diffusion region of source/drain. In order to control and/or define a threshold voltage of the FET and possibly minimize leakage between source, drain and their extension regions, the FET usually contains a well and halo implant of opposite polarity near the deep diffusion and extension regions.

Furthermore, for example, in high performance logic integrated circuits, the above components of a FET are generally made or formed to be symmetric with respect to the gate of the FET. More specifically, the source-side structure may be made identical to the drain-side structure, that is, depth, dopant type, lateral diffusion extent of deep diffusion, extension, and halo implant may all intend to be made identical or at least substantially identical. Source and drain of a FET may only be distinguished by their electrical connectivity during usage. For example, in an n-type dopant doped FET (NFET), the drain may be a higher potential terminal, and in a p-type dopant doped FET (PFET) the drain may be a lower potential terminal, between a source terminal and a drain terminal of the FET.

It has been demonstrated that a regular FET with structural modification made independently to each side of the FET, in other words, an asymmetric FET structure may achieve better performance than a symmetric structure implementation of the FET in certain aspect. For example, it has been demonstrated that performance of an FET may be improved through reduction in resistance on the source side, with the use of higher source extension dosage, and through reduction in capacitance on the drain side, with the use of lower halo dosage or halo implant. In view of the potential benefits, different low cost manufacturing methods and/or approach of creating asymmetric FET structure have been explored.

So far, several methods have been proposed for creating asymmetric FET structures which include, for example, a method that uses a patterned photoresist to define regions that do not receive ion implants from regions, defined by openings in the patterned photoresist, that need to receive ion implants. For example, the source of a FET transistor may be unblocked for ion implant by an opening in a photoresist layer while the drain of the FET transistor will be blocked or covered by the photoresist layer. Further for example, a method is proposed wherein both the angle of implantation and the openings of photoresist need to be controlled carefully. By this method, a photoresist edge may block the implant into a nearby transistor by shadowing the angled implant even though the photoresist is open over the transistor that is to be blocked from implant. However, this method may not be able to accommodate creating FETs with relatively small geometry due to the difficulty in placing an edge of a photoresist over the FETs, which require the photoresist to block on one side and open on the other side of the FETs. As a result, a large variation in photoresist edge placement may occur which shrinks the manufacturing tolerance in the shadowing of the FETs during ion implantation.

The difficulties in creating asymmetry FET devices are expected to worsen even more with the transistors of shrinking dimension becoming to have even smaller geometries and the distance between them becoming even closer, as being generally predicated by the continued scaling in semiconductor technology. In particular, the technique and/or method currently proposed will encounter unavoidable difficulties in opening small areas of photoresist, with photoresist bridging, or scumming, onto adjacent transistor gates. Regions that are required to be opened in the photoresist exposure and development will be increasingly difficult to open when spacing between photoresist edge and FET gate become smaller. In such bridged regions, an implant will be fully or partially blocked while the intended action is not to block the implantation.

SUMMARY OF THE INVENTION

Therefore there is a need for a method to create a transistor with asymmetric source and drain that may be implemented at very small gate dimensions and spacing. The method described in this invention does not rely on opening photoresist between small geometry openings and so the problems with the prior art in small geometries are avoided.

An embodiment of the present invention provides a method of forming asymmetric field-effect-transistors (FETs). The method includes forming at least a first and a second gate-mask stack on top of a semiconductor substrate, wherein the first and second gate-mask stacks include at least, respectively, a first and a second gate conductor of a first and a second transistor and have, respectively, a top surface, a first side, and a second side with the second side being opposite to the first side; performing a first halo implantation from the first side of the first and second gate-mask stacks at a first angle while applying the first gate-mask stack in preventing the first halo implantation from reaching a first source/drain region of the second transistor, wherein the first angle is equal to or larger than a predetermined value; and performing a second halo implantation from the second side of the first and second gate-mask stacks at a second angle, thereby creating halo implant in a second source/drain region of the second transistor, wherein the first and second angles are measured against a normal to the substrate and are substantially the same.

The second side of the first gate-mask stack and the first side of the second gate-mask stack are separated by a distance D1, the first gate-mask stack includes a first gate conductor of height H1 and a first hard-mask of height H2. In one embodiment, the first and second angles have a value larger than arctangent of (D1/(H1+H2)). In another embodiment, the first and second angles are between arctangent of (D1/(H1+H2)) and arctangent (D1/H1). The method further includes creating halo implant in a second source/drain region of the first transistor during the second halo implantation.

The first hard-mask is self-aligned with the first gate conductor, and the second hard-mask is self-aligned with the second gate conductor. The first and second gate conductors are in turn self-aligned with a channel region of the first and second transistors. For example, the first and second gate-mask stacks may be formed by forming a hard mask pattern on top of a gate conducting layer being deposited on top of the substrate, and transferring the hard mask pattern to the gate conducting layer through an etch process.

A shallow ion implantation may also be performed from both the first and second sides of the second transistor, at an angle smaller than the predetermined value, to form source/drain extension regions of the second transistor.

According to another embodiment, the method may include forming at least a first and a second gate-mask stack on top of a semiconductor substrate, wherein the first and second gate-mask stacks include, respectively, a first and a second gate conductor of a first and a second transistor and a first and a second multilayer hard masks on top of the first and second gate conductors and the first and second gate-mask stacks have a height H0 and are separated by a distance D1; removing a first layer of the multilayer hard mask of the second gate-mask stack, thereby the second gate-mask stack has a reduced height H1; performing a first halo implantation from a first side of the first and second gate-mask stacks at a first angle while applying the first gate-mask stack in preventing the first halo implantation from reaching a first source/drain region of the second transistor, wherein the first angle is between arctangent (D1/H0) and arctangent (D1/H1); and performing a second halo implantation from a second side of the first and second gate-mask stacks at a second angle, thereby creating halo implant in a second source/drain region of the first transistor, wherein said second angle is substantially same as said first angle. In one embodiment, the first and second multilayer hard masks include multiple hard mask layers that are separated by one or more etch-stop layers, and are self-aligned to their respective gate conductors underneath.

According to yet another embodiment, the method may include forming a plurality of gate-mask stacks on top of a semiconductor substrate; performing a first halo implantation from a first side of the plurality of gate-mask stacks at a first angle while applying at least a first gate-mask stack, corresponding to a first transistor, of the plurality of gate-mask stacks in preventing the first halo implantation from reaching a first source/drain region of a neighboring transistor next to the first transistor. In one embodiment, the plurality of gate-mask stacks have substantially same height and are not equally spaced. In another embodiment, the plurality of gate-mask stacks have different height and are equally spaced.

BRIEF DESCRIPTION OF THE DRAWINGS

The invention will be understood and appreciated more fully from the following detailed description of the invention, taken in conjunction with the accompanying drawings of which.

Figure 1:
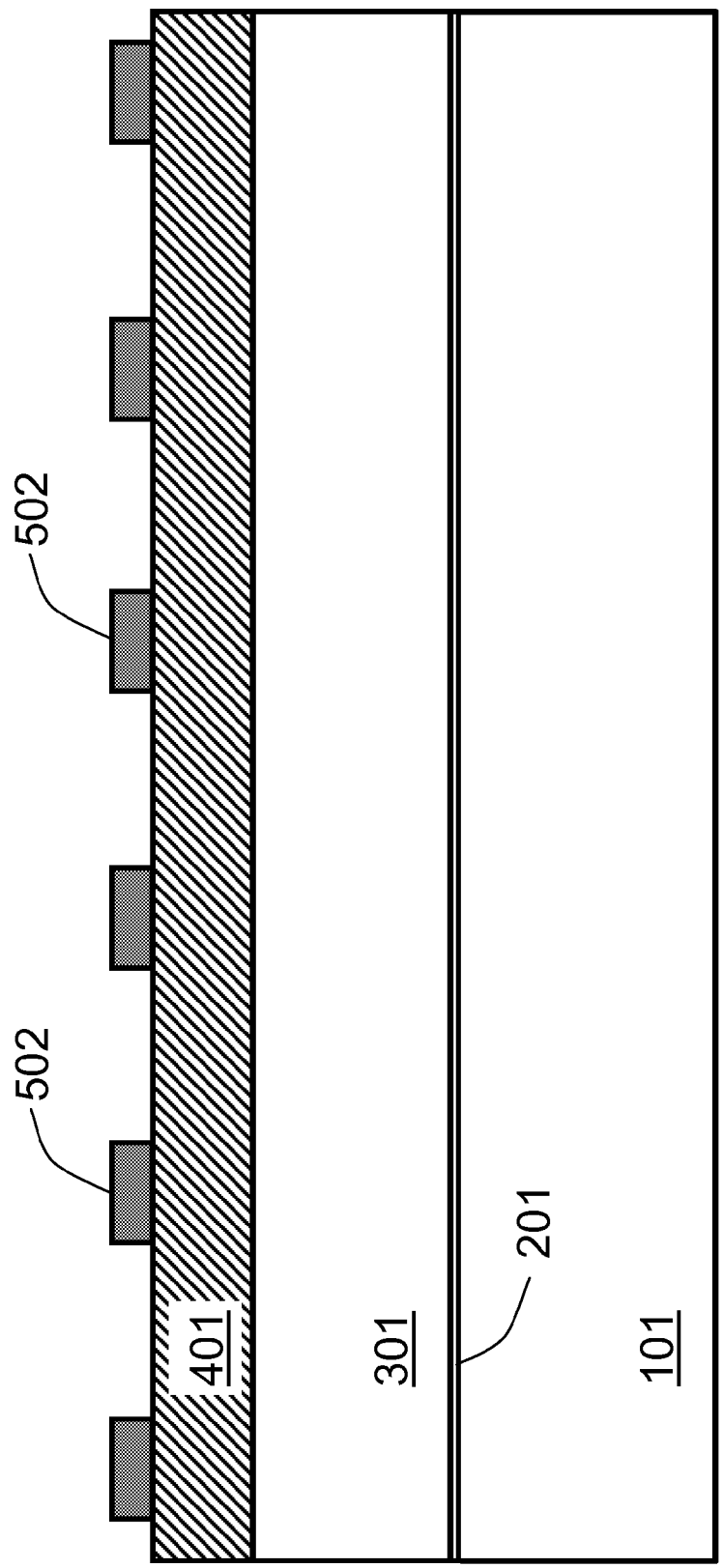
FIG. 1 is a demonstrative illustration of a method of forming photoresist pattern in creating asymmetrical field-effect-transistors according to an embodiment of the invention.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or patent applications for reference in order not to obscure description of essences and/or embodiments of the invention. It is to be understood that the following descriptions have rather focused on distinctive features and/or elements of various embodiments of the invention.

FIG. 1 is a demonstrative illustration of a method of forming photoresist pattern in creating asymmetric field-effect-transistors according to an embodiment of the invention. For example, an embodiment of the invention may include providing a semiconductor substrate 101, forming a gate insulating layer 201 on top of substrate 101, forming a gate conducting layer 301 on top of gate insulating layer 201, and forming a hard mask layer 401 on top of gate conducting layer 301. In further more details, semiconductor substrate 101 may be a silicon substrate, a silicon on insulator (SOI) substrate, or any other substrates that are suitable for making semiconductor chips thereupon. Inside semiconductor substrate 101, there may be formed one or more shallow trench isolation (STI) regions (not shown) to separate and/or group semiconductor devices formed thereupon. Gate insulating layer 201 may be a dielectric layer for example and may be a silicon-oxide layer, a silicon-nitride layer, and/or other high dielectric constant (high-k) materials. Gate insulating layer 201 may be formed through deposition of a dielectric material and/or through oxidizing a top surface of semiconductor substrate 101, although embodiment of the present invention is not be limited in this respect and other methods of forming gate insulating layer 201 are highly contemplated as well. Gate insulating layer 201 may be formed to have a thickness typically around 1 to 3 nm. On top of gate insulating layer 201, gate conducting layer 301 may be formed through currently available front-end-of-the-line (FEOL) processes, like a deposition process, and/or any future developed techniques. Gate conducting layer 301 may be a polysilicon layer or a metal layer or a combination thereof and may have a thickness typically around 30 to 100 nm. In one embodiment, thickness of gate insulating layer 201 may be insignificant when being compared with thickness of gate conducting layer 301, and therefore may not be shown in some of the drawings.

Hard mask layer 401 may be formed on top of gate conducting layer 301 to have a thickness typically around 30 to 100 nm, which may be comparable with thickness of gate conducting layer 301. In general, hard mask layer 401 may be a dielectric layer and may be a material dissimilar to that of gate conducting layer 301, which may facilitate a selective etching process of hard mask layer 401 against gate conducting layer 301 or vise versa. For example, gate conducting layer 301 may be a polysilicon layer and hard mask layer 401 may be a silicon-nitride layer. To pattern hard mask layer 401, a photoresist layer may be applied on top of hard mask layer 401, which may be subjected to a lithographic patterning process subsequently and formed into a photoresist pattern 502 on top of hard mask layer 401. Photoresist pattern 502 may define areas where gate-mask stacks, to be made of gate conducting layer 301 and/or hard mask layer 401, may be formed as being described below in more details. The gate-mask stacks may include gate conductors of a set of field-effect-transistors (FET).

Figure 2:
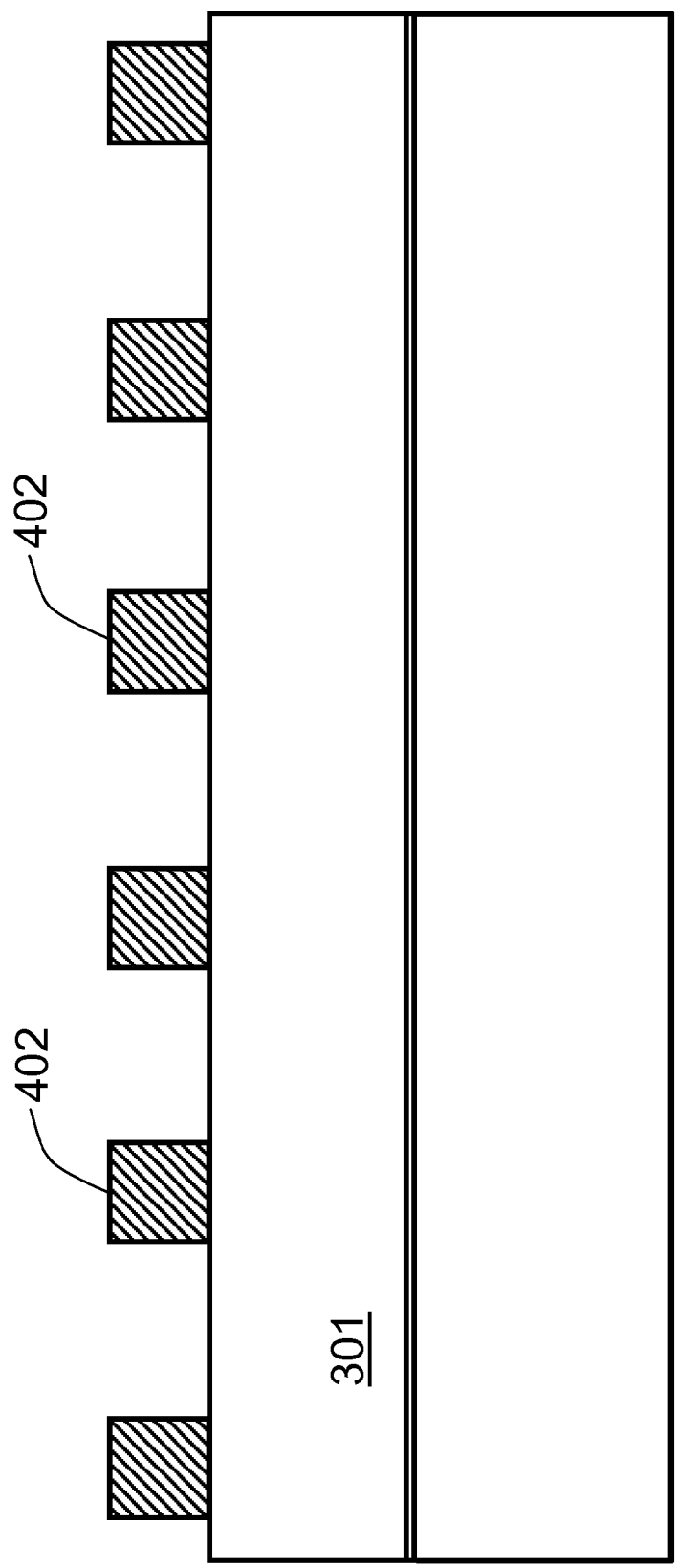
FIG. 2 is a demonstrative illustration of a method of forming hard mask pattern in creating asymmetrical field-effect-transistors according to another embodiment of the invention.

FIG. 2 is a demonstrative illustration of a method of forming hard mask pattern in creating asymmetric field-effect-transistors according to another embodiment of the invention. With photoresist pattern 502 of FIG. 1 being used as a blocking mask, hard mask layer 401 of FIG. 1 may be subjected to an etching process, which may be selective to gate conducting layer 301, and be formed into a hard mask pattern 402 as being illustrated in FIG. 2. Since hard mask layer 401 may be made of a material dissimilar to that of gate conducting layer 301, the selective etching process may stop at a top surface of gate conducing layer 301. After being transferred to hard mask pattern 402, photoresist pattern 502 may be removed by using any known technique, such as wet lifting, leaving hard mask pattern 402 on top of gate conducting layer 301.

Figure 3:
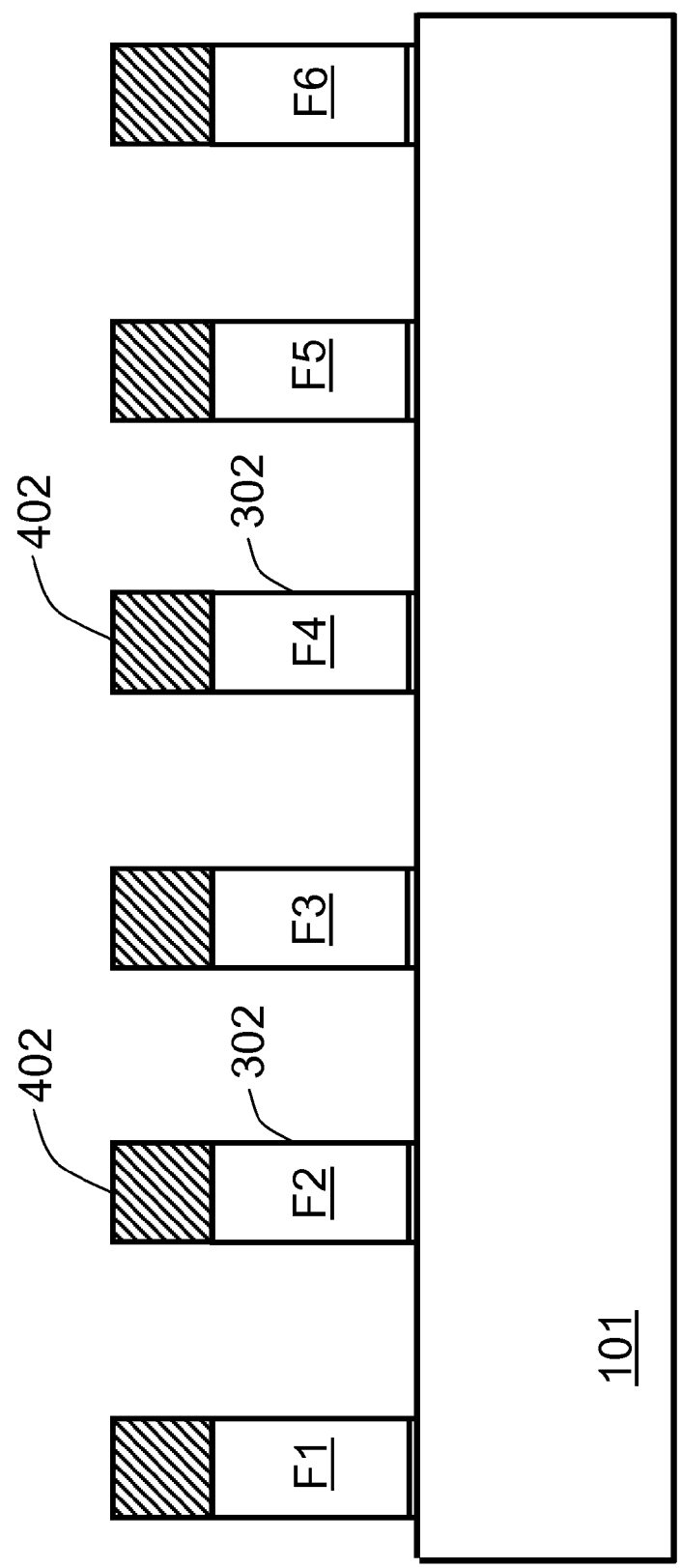
FIG. 3 is a demonstrative illustration of a method of forming gate-mask stacks in creating asymmetrical field-effect-transistors according to yet another embodiment of the invention.

FIG. 3 is a demonstrative illustration of a method of forming gate-mask stacks in creating asymmetric field-effect-transistors according to another embodiment of the invention. For example, with hard mask pattern 402 being used as a blocking mask, gate conducting layer 301 may be subjected to an etching process, and therefore be formed into a set of gate conductors 302. Hereinafter, the meaning of word "set" may include singular "one". For example, gate conductors 302 may include gate conductors of a set of field-effect-transistors (FET) F1, F2, F3, F4, F5, and F6, to be formed on top of semiconductor substrate 101 as being described below in more details. In one embodiment, transistor F1, F2, F3, F4, F5, and F6 may be formed to be similar to each other, except their source/drain doping profiles, and may be substantially equally spaced on top of semiconductor substrate 101. For example, transistor F1, F2, F3, F4, F5, and F6 may have a spacing there between less than, for example, 150 nm and preferably between 10 to 150 nm. Hereinafter, gate conductor 302 and hard mask pattern 402 may be collectively referred to as a gate-mask stack. In one embodiment, a gate-mask stack may include only the gate conductor with the hard mask or hard masks normally on top thereof being removed. A person skilled in the art will appreciate that hard masks 402 formed according to embodiment of the invention, as being described above, are self-aligned to their respective gate conductors 302. Gate conductors 302 are self-aligned to a channel region underneath of their respective transistors, e.g., transistors F1, F2, F3, F4, F5, and F6.

Following the formation of gate conductors 302, spacers may be optionally formed at sidewalls of gate conductors 302. Here, it is to be understood that embodiment of the invention is not limited in this respect and spacers may be formed at other stages, for example at a later stage, depending upon actual doping profile design, proximity of doping to channel, and other factors. If being formed, the spacers may be formed by well-known process of deposition and anisotropic etching, and may be formed from a material that is different from that of hard mask pattern 402. By using a material different from that of hard mask pattern 402, the hard mask patterns 402 remain at least substantially intact during the anisotropic and selective etching process of the spacer materials. For instance, if the material of hard mask pattern 402 is silicon nitride, the spacer material may be silicon oxide.

Figure 4:
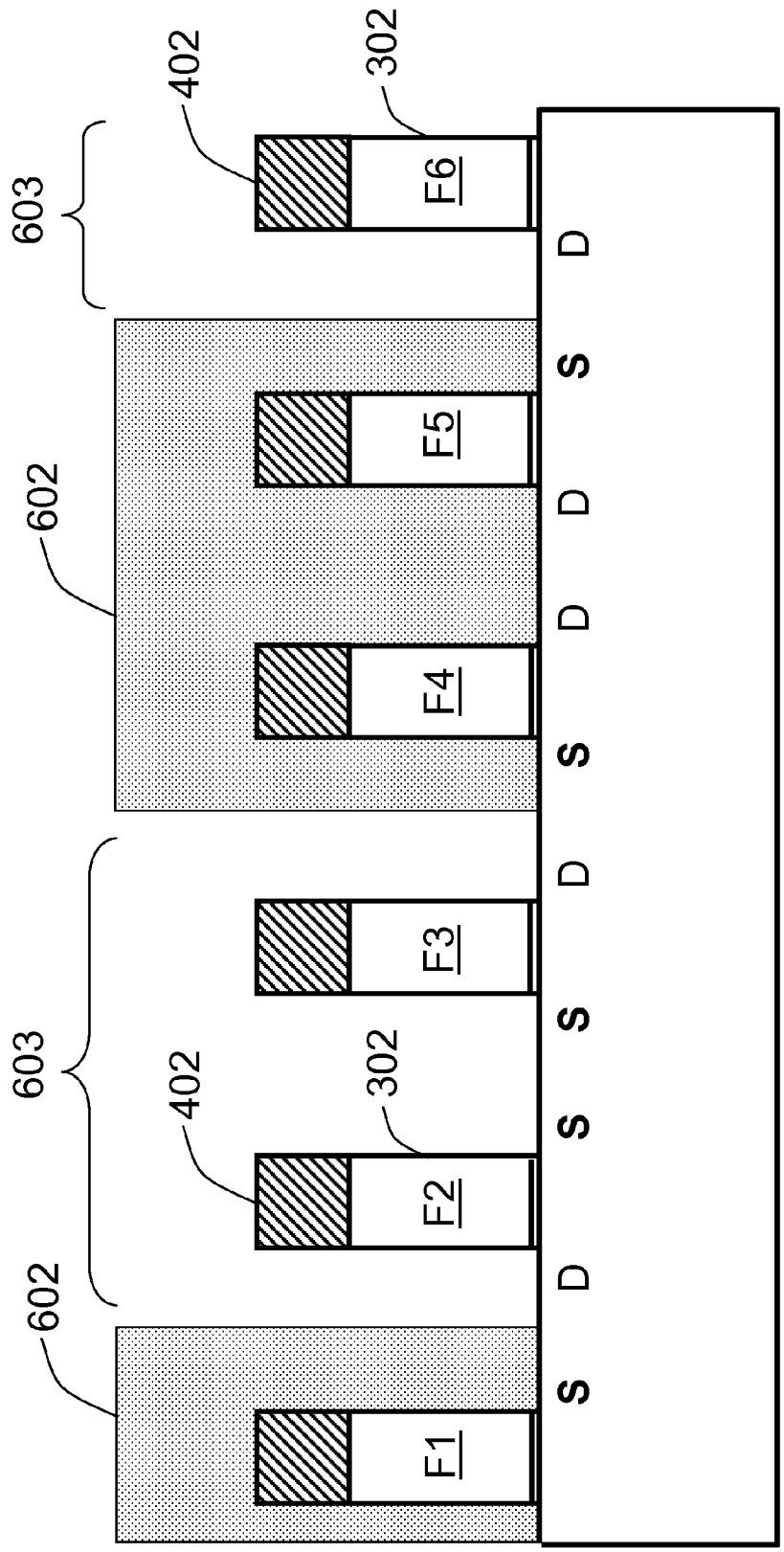
FIG. 4 is a demonstrative illustration of a method of covering some gate-mask stacks in creating asymmetrical field-effect-transistors according to yet another embodiment of the invention.

FIG. 4 is a demonstrative illustration of a method of covering some gate-mask stacks in creating asymmetric field-effect-transistors according to another embodiment of the invention. For example, an embodiment of the invention may include selectively covering some, while exposing other, hard masks 402 in preparation for removing the exposed hard masks 402 based upon certain FET layout design. In more details, a photoresist layer for example, although other material may be used as well, may be applied on top of transistor F1, F2, F3, F4, F5, and F6 and may be then subjected to a lithographic patterning process to form into a photoresist pattern 602. As a result, photoresist pattern 602 may be formed on top of and cover, for example, transistor F1, F4, and F5 and may have openings 603 to expose, for example, transistor F2, F3, and F6.

Photoresist pattern 602 may be formed to enable selective removal of certain hard masks 402 on gate conductors of certain transistors, for example transistors F2, F3, and F6. Therefore, it may be sufficient so long as photoresist pattern 602 exposes hard masks 402 that are to be removed, i.e., hard masks 402 that are on top of gate conductors of transistors F2, F3, and F6. In other words, edges of photoresist pattern 602 may be formed to lie in anywhere between, for example, transistor F3 and transistor F4. Therefore, an embodiment of the invention provides a relatively larger process window in forming photoresist pattern 602.

In one embodiment of the invention, transistor F1 may be formed to have a source ("S") adjacent to a drain ("D") of transistor F2; transistor F4 may be formed to have a source adjacent to a drain of transistor F3; transistor F2 and transistor F3 may be adjacent to each other and may be formed to have their respective sources adjacent to each other. Additionally, transistor F4 and transistor F5 may be adjacent to each other and may be formed to have their respective drains adjacent to each other. The arrangement of transistors F1, F2, F3, F4, and F5, where such transistors are n-type transistors, may provide the NFET portion of a two-input NAND circuit utilizing series connected F1 and F2, and two-input NOR circuit utilizing parallel connected F4 and F5. Transistors F3 and F6 may not be used, depending on the circuit configuration and connectivity required. Here, it is to be understood that embodiments of the invention is not limited in this respect and other arrangement of transistors may be possible, by applying embodiment of the invention in forming asymmetric FETs, to provide different functionality of different circuit configuration.

Figure 5:
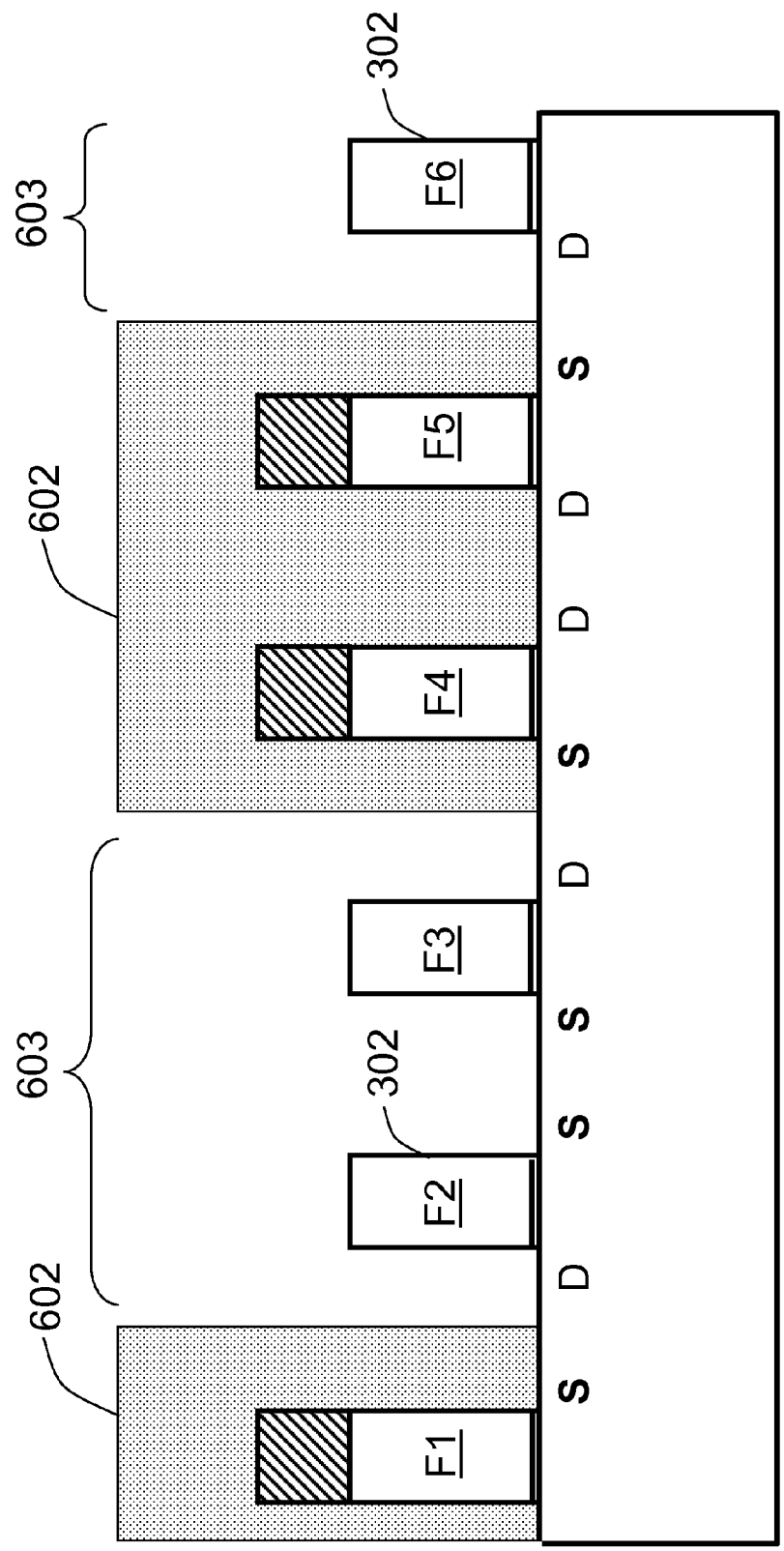
FIG. 5 is a demonstrative illustration of a method of removing hard masks from selected gate-mask stacks in creating asymmetrical field-effect-transistors according to yet another embodiment of the invention.

FIG. 5 is a demonstrative illustration of a method of removing hard masks from selected gate-mask stacks in creating asymmetric field-effect-transistors according to another embodiment of the invention. For example, an embodiment of the invention may include removing some hard masks 402 (FIG. 4), which are not covered and/or protected by photoresist pattern 602, to expose top surfaces of gate conductors of transistor F2, F3, and F6. The removal of hard masks 402 may be made through a wet etch process and/or by an anisotropic or isotropic dry etch process, which may be a selective etching process, although embodiment of the invention is not limited in this respect and other removal techniques may be used. Hard masks that remain on top of gate conductors are self-aligned to the gate conductors, which in turn are self-aligned to the channel regions of their respective transistors, for example transistors F1, F4, and F5.

Figure 6:
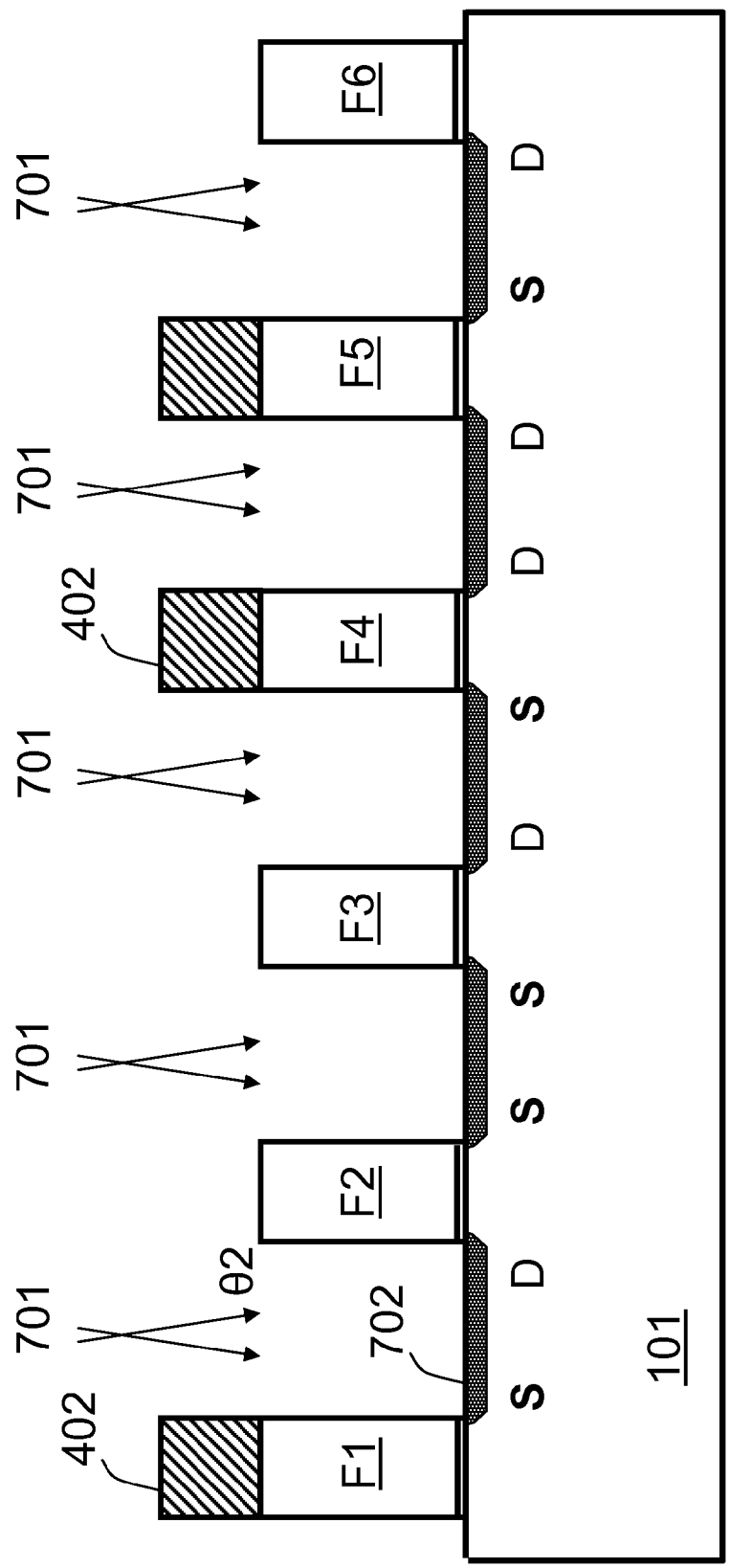
FIG. 6 is a demonstrative illustration of a method of performing source/drain extension ion implantation in creating asymmetrical field-effect-transistors according to yet another embodiment of the invention.

FIG. 6 is a demonstrative illustration of a method of performing source/drain extension ion implantation in creating asymmetric field-effect-transistors according to another embodiment of the invention. After selectively removing some hard masks 402, photoresist pattern 602 of FIG. 5 may be removed, leaving gate conductors of transistors F1, F2, F3, F4, F5, and F6 either being covered by hard mask 402 or being exposed. Extension regions 702, the dark shaded areas between gate conductors, of transistors F1, F2, F3, F4, F5, and/or F6 may be formed through an ion implantation process 701. Ions may be lightly doped into source ("S") and/or drain ("D") regions of transistors F1-F6. The type of ion used in the ion implantation process may depend upon the type of transistors being formed. For example, in forming N-type FET, phosphorous (P) or arsenic (Ar), or any other suitable N-type dopants may be used in the implantation, and in forming P-type FET, Boron (B), BF2, Indium (In), or any other suitable P-type dopants may be used in the implantation. The implantation may be performed from a first side (for example a left side) and a second side (for example a right side) of gate conductors F1-F6, and may be performed at a sufficiently small angle $\theta 2$, in the range of 0-degrees to 15-degrees, measured against a normal to substrate 101, such that the existence of hard mask patterns 402 on top of some gate conductors and the gate conductors themselves may not affect and/or pose obstacle to the ion implantation process. Hereinafter, except otherwise being specified, all the angles are measured against the normal to the substrate. Here, it is to be understood that embodiment of the invention is not limited in this respect and the formation of source/drain extension regions may be performed at a later stage depending upon particular design and/or manufacturing procedures.

Figure 7:
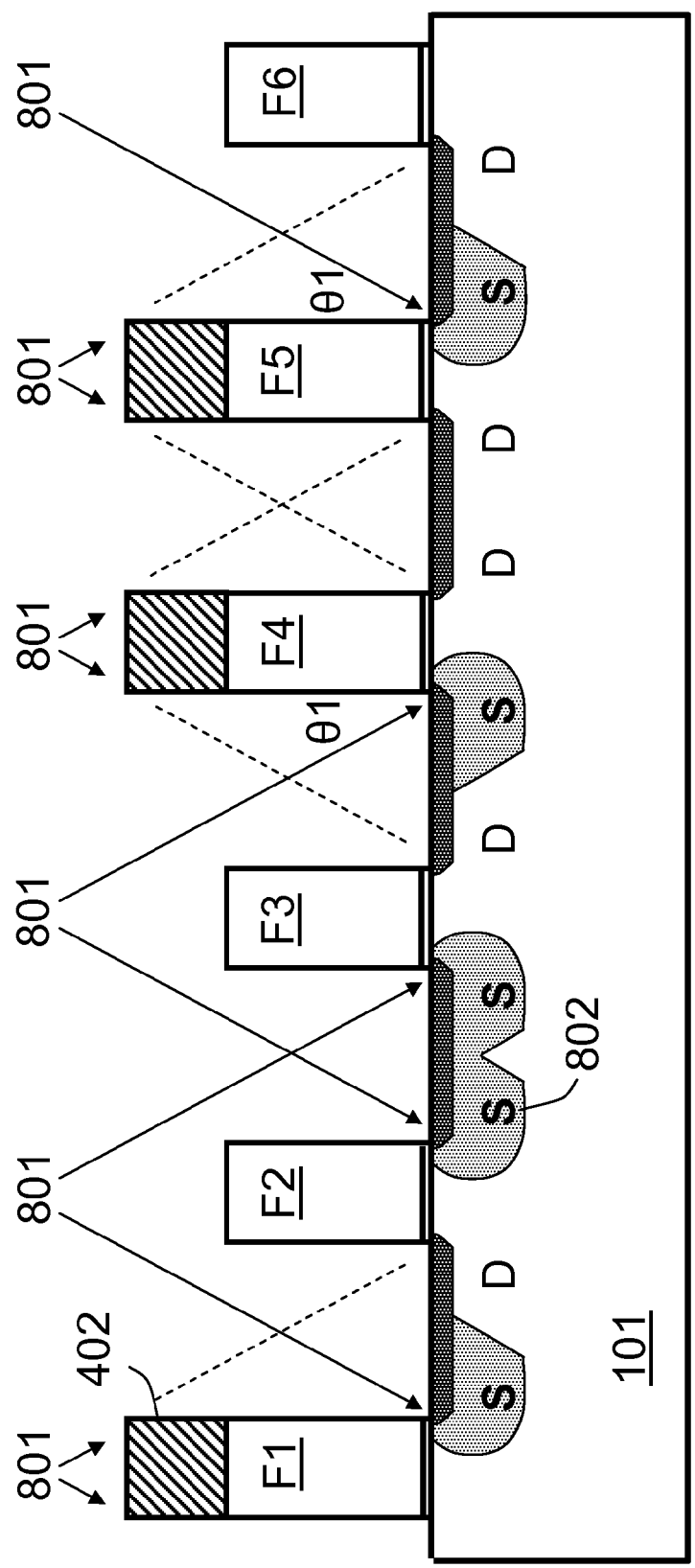
FIG. 7 is a demonstrative illustration of a method of performing halo implantation in creating asymmetrical field-effect-transistors according to yet another embodiment of the invention.

FIG. 7 is a demonstrative illustration of a method of performing halo implantation in creating asymmetric field-effect-transistors according to another embodiment of the invention. For example, an embodiment of the invention may include performing source halo implantation for a set of selected transistors. The implantation 801 may be performed from a first side, for example a left side, and/or a second side, for example a right side, of transistors F1-F6, with the second side (e.g., right side) being opposite to the first side (e.g., left side). The implantation may be performed at a sufficiently large angle $\theta 1$, measured from a normal to substrate 101, such that hard masks 402, when present, may block the implantation from reaching a source/drain region of an adjacent transistor, as being illustrated in FIG. 7 by a short arrow 801 followed by a dashed line. On the other hand, angle $\theta 1$ of implantation may be small enough such that a gate conductor (e.g., gate conductor of transistor F2), without hard mask 402 on top thereof, will allow and not block implantation reaching a source/drain region of an adjacent transistor such as transistors F1 and F3, as being illustrated in FIG. 7 by a long arrow 801 pointing directly at the source/drain regions 802 as being lightly shaded in FIG. 7.

Angle $\theta 1$ may be between about 15 degrees and about 45 degrees, preferably between 20 and 40 degrees, and more typically around 30 degrees and may be chosen to suit for the implantation process as described above. The implantation angle may also be adjusted, together with dosage and energy used, to improve and/or optimize electrical properties of transistors F1-F6. The implantation may provide a deep halo implant in a source region, for example, using P-type dopant for NFET and N-type dopant for PFET. In one embodiment, a higher dose shallow depth extension may be performed at this stage, at the same or similar angle as that for the halo implant 801. This may be performed in addition to the source/drain extension implantation 701 performed at smaller angle $\theta 2$ (FIG. 7) for transistors F1-F6. The source-only higher dose extension implantation may provide the benefit of lower resistance on the source side. Even though the added dose on the source extension may cause higher capacitance to the gate, the impact of this high capacitance will be less detrimental than a higher drain capacitance (where Miller effect is observed) and a favorable and/or acceptable tradeoff in order to establish lower source resistance.

Here, it is to be understood that steps and/or procedures described above and illustrated in FIG. 6 and FIG. 7 may be applied to NFET with the PFET being blocked by photoresist and masking steps, and again to PFET with the NFET being blocked by photoresist and masking steps. However, in order not to obscure essence of the invention, details of these steps are not described here as they may be derived from the above described method.

Figure 8:
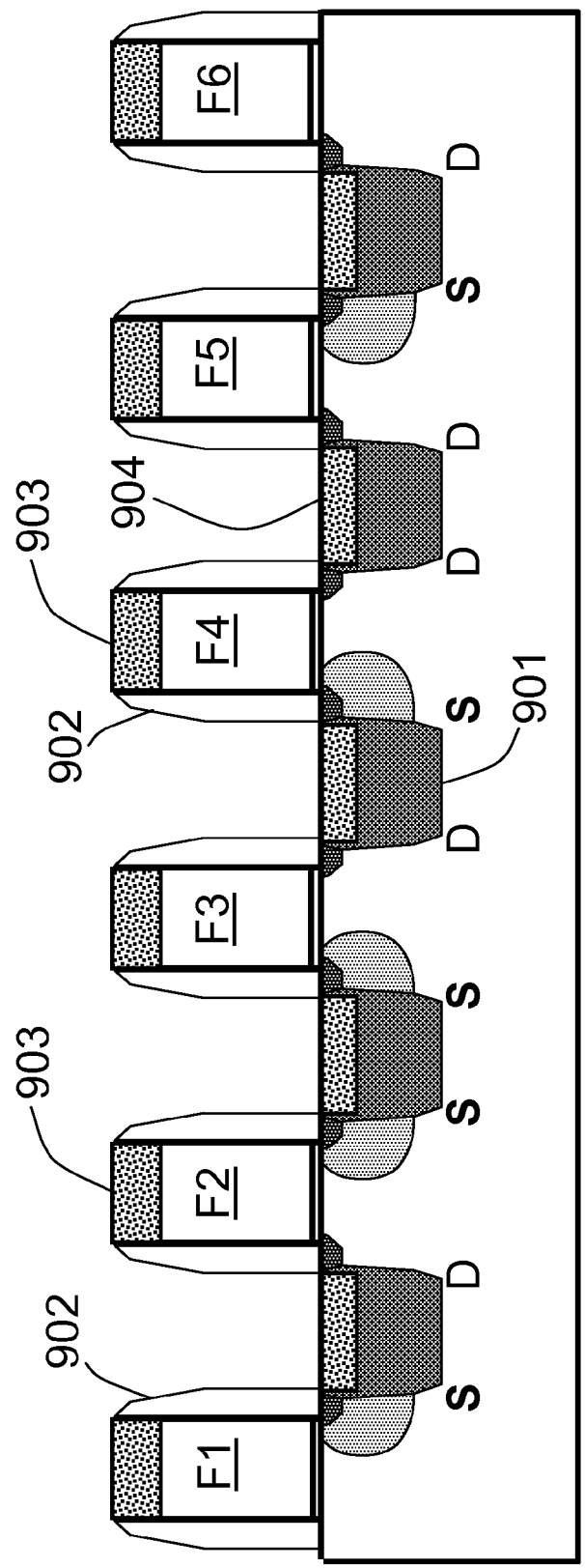
FIG. 8 is a demonstrative illustration of a method of forming spacers and source/drain silicide in creating asymmetrical field-effect-transistors according to yet another embodiment of the invention.

FIG. 8 is a demonstrative illustration of a method of forming spacers and source/drain silicide in creating asymmetric field-effect-transistors according to another embodiment of the invention. For example, hard mask layer 402 (FIG. 7) remaining on some of the gate conductors may be removed by etch. A dielectric layer may be deposited and anisotropically etched, if necessarily, to form spacers 902 to separate deep source/drain regions 901 from gate regions of transistors F1-F6. Deep source/drain regions 901 may be formed by a subsequent deep ion implantation process, performed at smaller angles like $\theta 2$, followed by a high-temperature (around 900 to 1050 degree Celsius) anneal process to activate and diffuse the implanted dopants. Additionally, silicide may be formed on silicon surfaces, at tops of gates (903) and on top of deep source/drain diffusion regions (904). Contact and metallization are formed to complete the integrated circuit.

Figure 9:
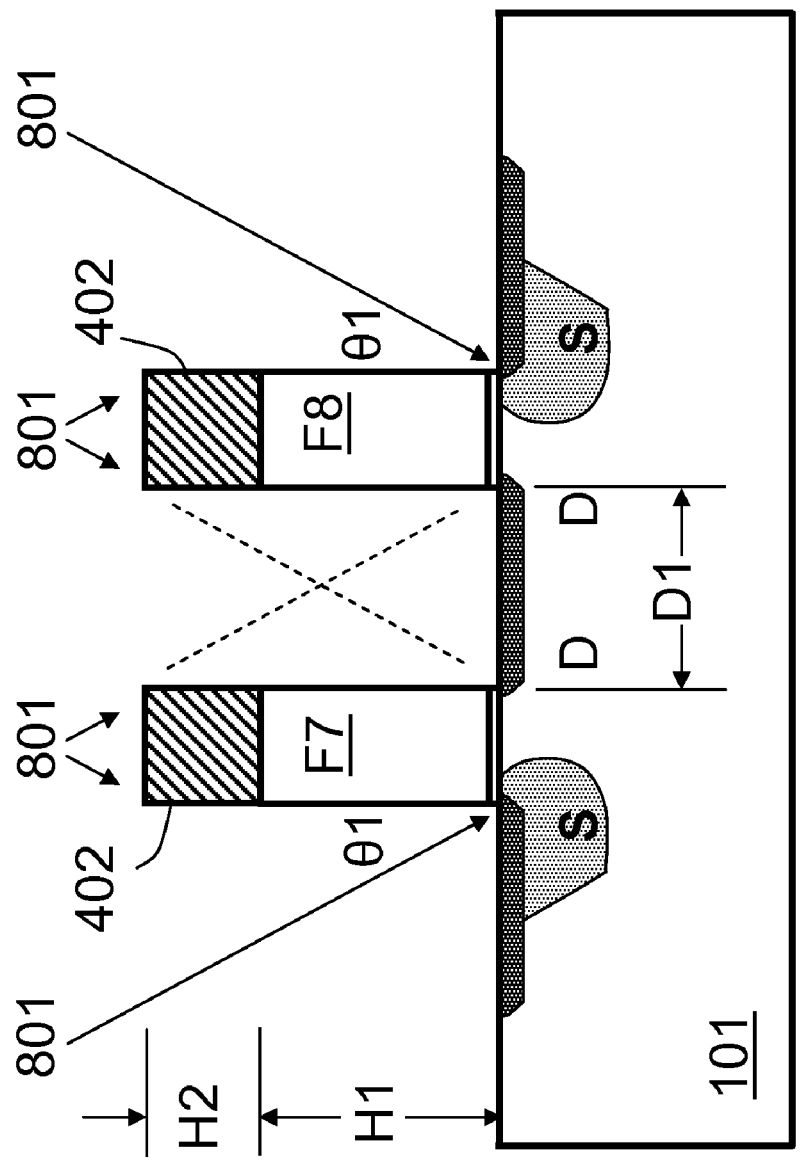
FIG. 9 is a demonstrative illustration of a method of performing halo implantation in creating asymmetrical field-effect-transistors according to an embodiment of the invention.

FIG. 9 is a demonstrative illustration of a method of performing halo implantation in creating asymmetric field-effect-transistors according to an embodiment of the invention. To generalize, the embodiment includes forming a first gate-mask stack having a first gate conductor of a first transistor F7 and a second gate-mask stack having a second gate conductor of a second transistor F8 on top of a semiconductor substrate 101. In other words, both first and second gate conductors may be covered at their top surfaces by a hard mask 402. The invention may include performing a first halo implantation 801 from the left side of the gate-mask stacks at an angle $\theta 1$, which is measured against a normal to substrate 101, and using the first gate-mask stack to prevent the first halo implantation from reaching a first source/drain region ("D") of second transistor F8, and performing a second halo implantation 801 from the right side of the gate-mask stacks at an angle substantially the same as angle $\theta 1$, and creating halo implant in a second source/drain region ("S") of second transistor F8.

As being illustrated in FIG. 9, the right side of gate conductor of transistor F7 may be separated by a distance D1, preferably more than 10 nm but less than 150 nm, from the left side of gate conductor of transistor F8. The gate conductors of transistors F7 and F8 have a height H1, typically between 30 nm and 100 nm, and hard masks 402 on top thereof have a height H2, typically between 30 nm and 100 nm. Without taking into account the thickness of gate insulating layer 201 of FIG. 1 underneath the gate conductors (which may be insignificant comparing with the thickness of gate conductor and/or hard mask 402). Angle $\theta 1$ may have a value between arctangent of $(D1/(H1+H2))$ and arctangent of $(D1/H1)$. For example, in one embodiment angle $\theta 1$ may be between 20 and 40 degrees.

Figure 10:
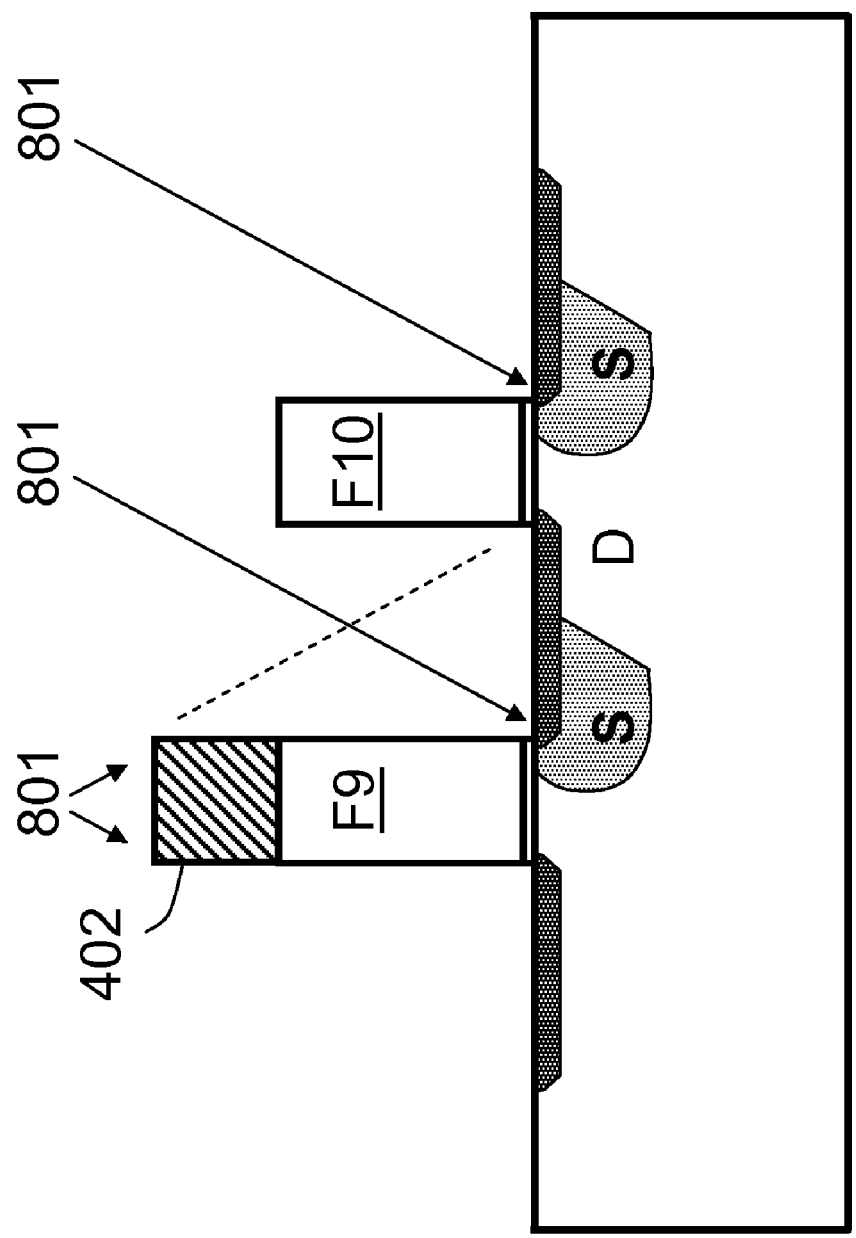
FIG. 10 is a demonstrative illustration of a method of performing halo implantation in creating asymmetrical field-effect-transistors according to another embodiment of the invention.

FIG. 10 is a demonstrative illustration of a method of performing halo implantation in creating asymmetric field-effect-transistors according to another embodiment of the invention. As being illustrated, gate conductor of transistor F9 is covered by hard mask 402 but gate conductor of transistor F10 is exposed and not covered by any hard masks. An embodiment of the invention may perform a halo implantation 801 from the right side of both transistors to create halo implant at the right side source/drain region of transistor F9 and the right side source ("S") of transistor F10. When a halo implantation is performed from the left side of both transistors, the left side drain ("D") of transistor F10 may be prevented from halo implantation because of hard mask 402 on top of transistor F9. Whether halo implantation will be formed at the left side source/drain region of transistor F9 depends on whether there is any gate-mask stack exists to the left side of transistor F9, its height and distance to the left side of transistor F9.

Figure 11:
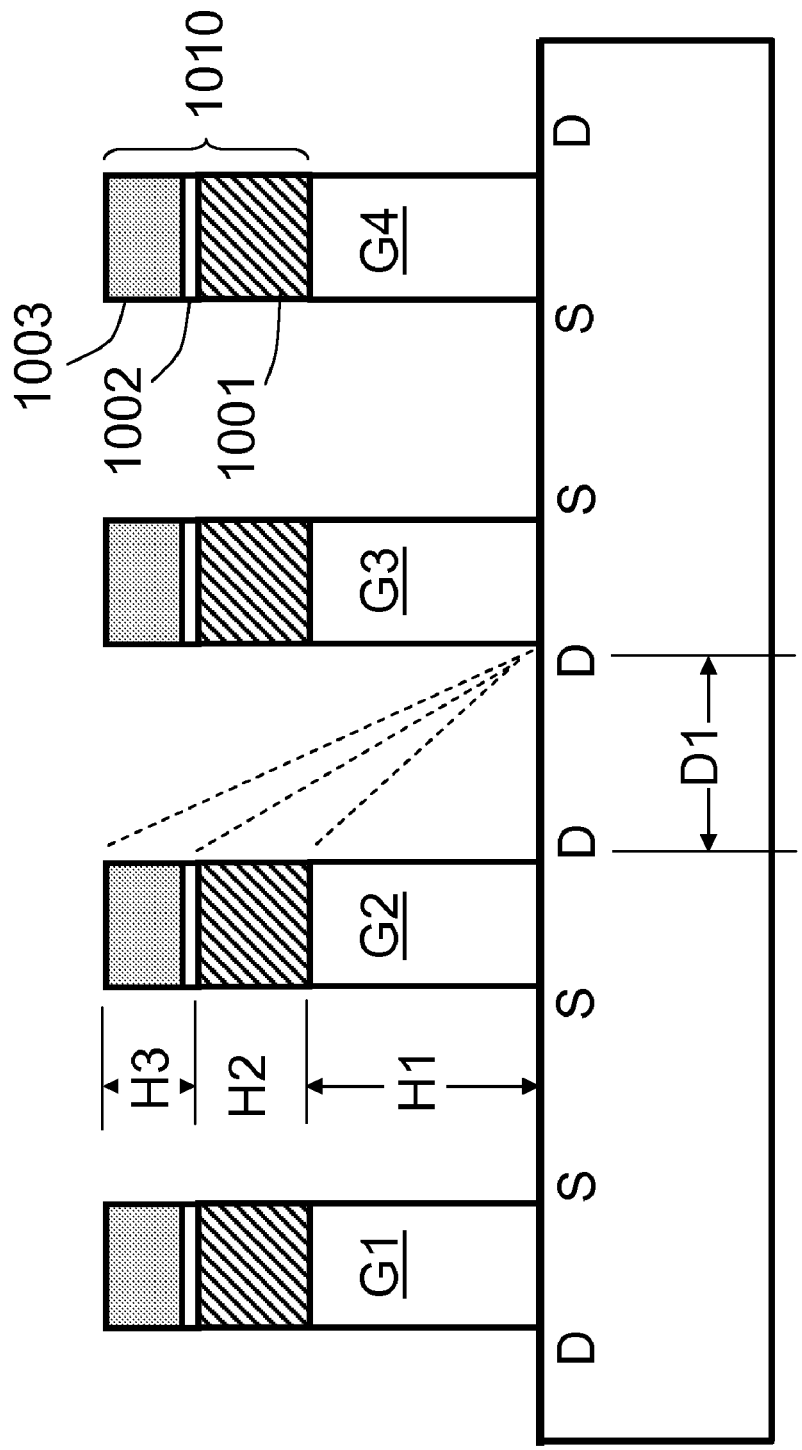
FIG. 11 is a demonstrative illustration of a method of forming multilayer hard masks in creating asymmetrical field-effect-transistors according to an embodiment of the invention.

FIG. 11 is a demonstrative illustration of a method of performing halo implantation in creating asymmetric field-effect-transistors according to an embodiment of the invention. For example, an embodiment of the invention may include forming gate conductors of transistors G1, G2, G3, and G4 that have a height H1, and are covered at their respect top surfaces by a multilayer hard mask 1010. Hereinafter, the term "multilayer" may also include only one layer. Hereinafter, the gate conductor and multilayer hard mask on top thereof may be collectively referred to as a gate-mask stack.

In more details, hard mask 1010 may include a first hard mask layer 1001 of a height H2 and a second hard mask layer 1003 of height H3 which may be optionally separated by an etch stop layer 1002 of insignificant thickness. In another embodiment of the invention, hard mask 1010 may include more than two hard mask layers. Different hard mask layers may be formed from different materials, preferably separated by one or more etch-stop layers, to facilitate an etching process to remove one or more thereof later. However, it is to be understood that embodiment of the invention may not be limited in this respect and the same materials may be used for different hard mask layers. For example, with the use of an etch stop layer, the etch stop layer may help removing one or more hard mask layers selectively even the hard mask layers may be made of the same material. Transistors G1, G2, G3 and G4 may be equally spaced by a distance D1 and their source ("S") and drain ("D") regions may be subjected to various implantation processes in subsequent procedures, for example halo implantation, as being described below in more details.

Figure 12:
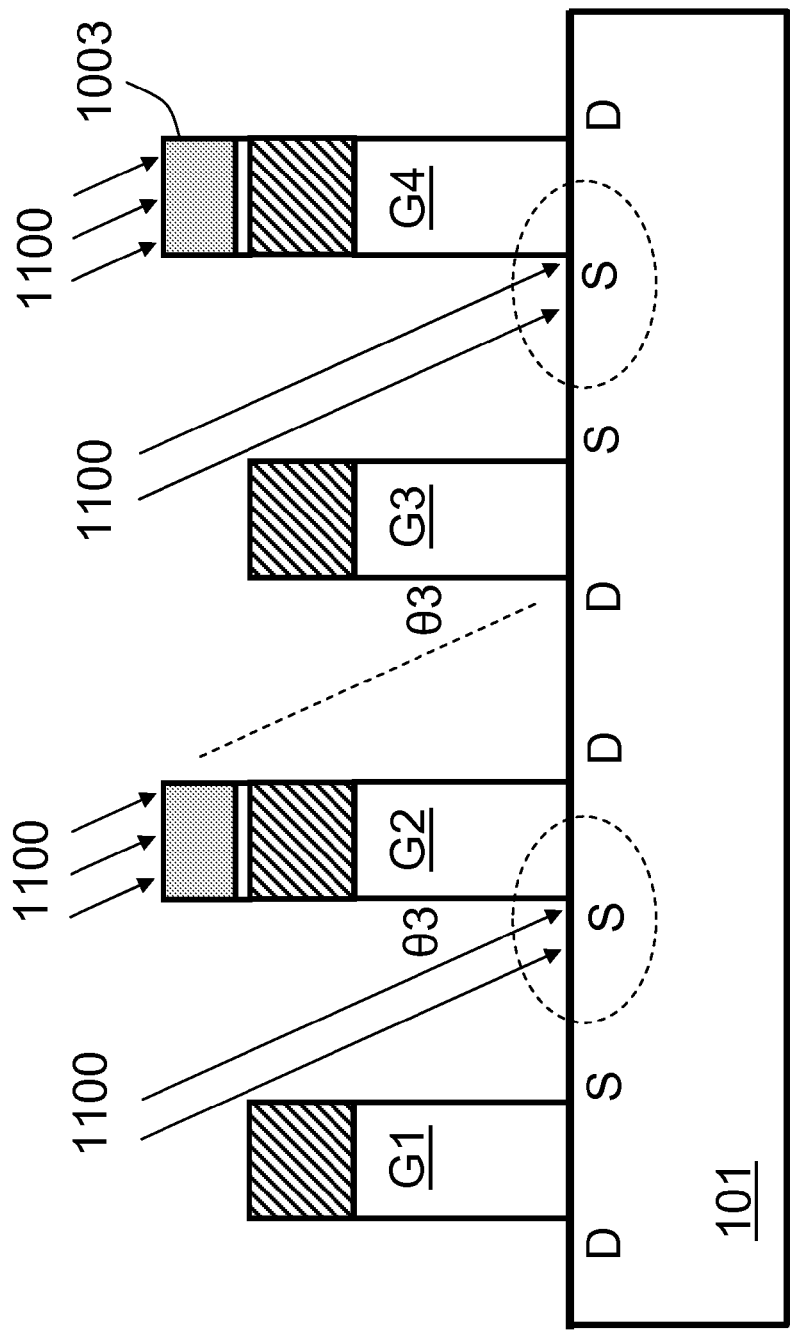
FIG. 12 is a demonstrative illustration of a method of performing halo implantation in creating asymmetrical field-effect-transistors according to another embodiment of the invention.

FIG. 12 is a demonstrative illustration of a method of performing halo implantation in creating asymmetric field-effect-transistors according to another embodiment of the invention. For example, an embodiment of the invention may include removing the second hard mask layer 1003 on selective gate conductors of, for example transistors G1 and G3, and performing a first halo implantation 1100 from the left side of transistors G1, G2, G3 and G4 and at an angle $\theta 3$ that is measured from the normal to substrate 101. With implantation angle $\theta 3$ being properly adjusted which may be preferably between the values of arctangent $(D1/(H1+H2+H3))$ and arctangent $(D1/(H1+H2))$, at least the second hard mask layer 1003 of the gate-mask stack for transistor G2 may be used in preventing the first halo implantation 1100 from reaching a drain region ("D") of transistor G3, for example, while source regions ("S") of transistors G2 and G4 may be implanted with the dopants used. A similar halo implantation may be optionally performed from the right side of transistors G1, G2, G3 and G4 as well, at a substantially same angle $\theta 3$.

Figure 13:
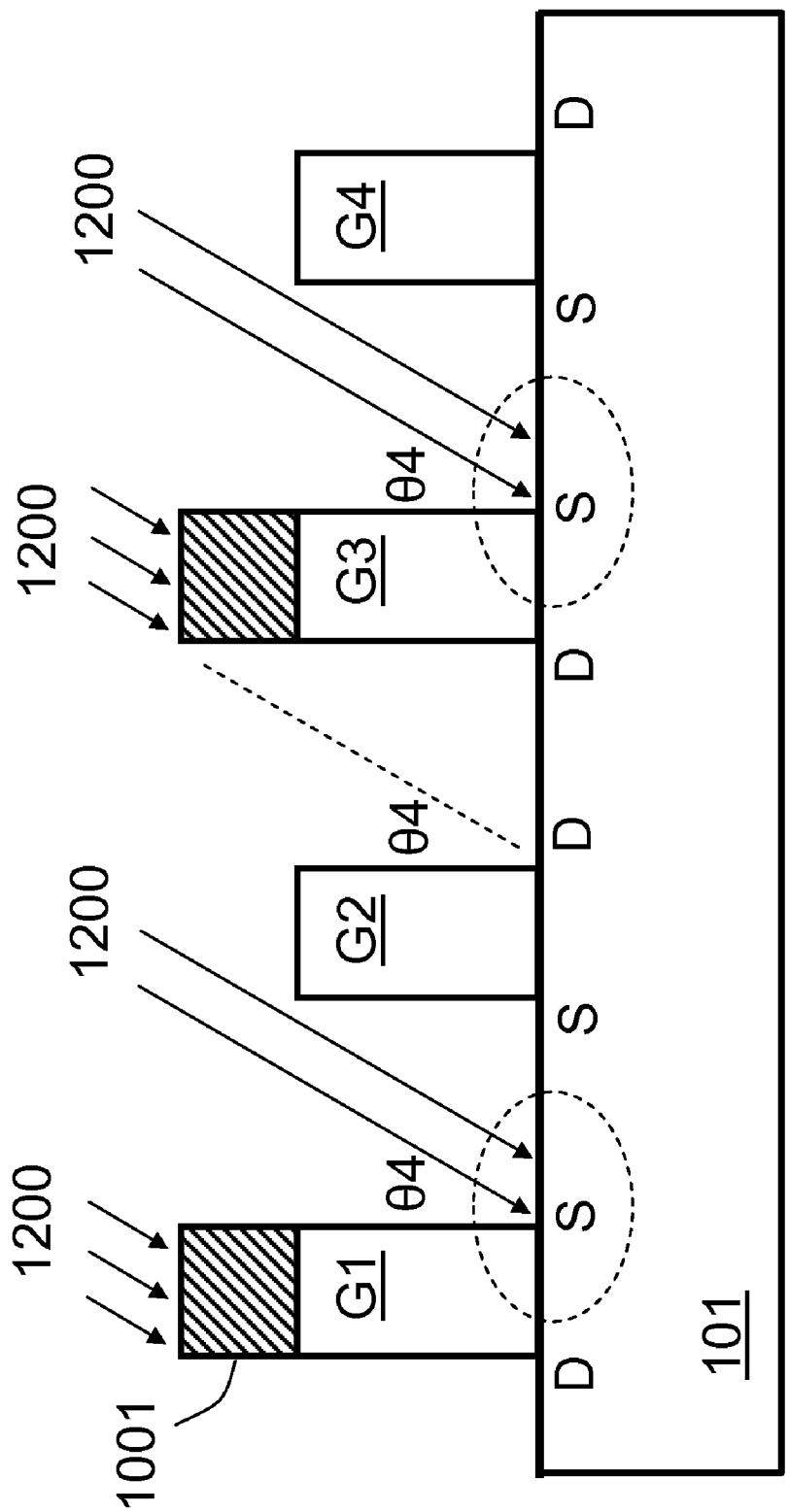
FIG. 13 is a demonstrative illustration of a method of performing halo implantation in creating asymmetrical field-effect-transistors according to yet another embodiment of the invention.

FIG. 13 is a demonstrative illustration of a method of performing halo implantation in creating asymmetric field-effect-transistors according to another embodiment of the invention. Following the first halo implantation as being described above, second hard masks 1003 of FIG. 12 may be removed from the rest of transistors, for example transistors G2 and G4. In addition, first hard mask layers 1001 may also be removed, together with etch stop layer 1002, selectively from the top surfaces of gate conductors of transistors G2 and G4. As a result, as being illustrated in FIG. 13, gate conductors of transistors G2 and G4 may be exposed and gate conductors of transistors G1 and G3 may be covered only by first hard mask layer 1001. Next, a second halo implantation 1200 may be performed from the right side of transistors G1, G2, G3 and G4 and at an angle θ4. With the implantation angle θ4 being properly adjusted to be preferably between the values of arctangent (D1/(H1+H2)) and arctangent (D1/H1), the first hard mask layer 1001 may be used in preventing the second halo implantation 1200 from reaching a drain region ("D") of transistor G2, while source regions ("S") of transistors G1 and G3 may be implanted with dopants used. A similar halo implantation may be optionally performed from the left side of transistors G1, G2, G3 and G4 as well, at a substantially same angle θ4.

Figure 14B:
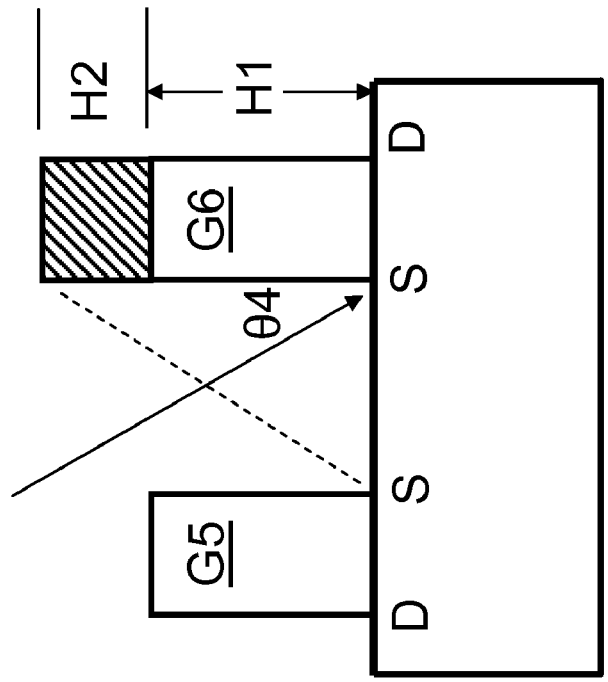
FIGS. 14A and FIG. 14B are demonstrative illustrations of a method of performing halo implantation in creating asymmetrical field-effect-transistors according to an embodiment of the invention.
Figure 14A:
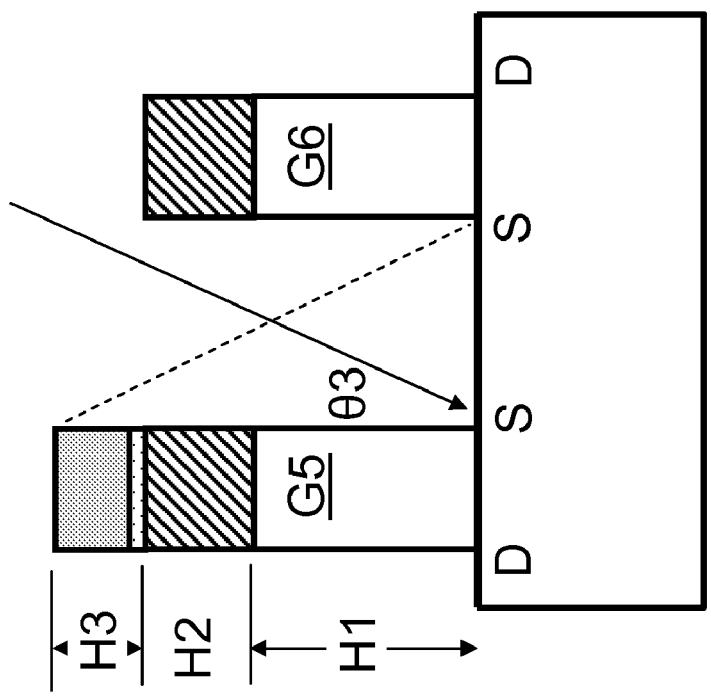

FIGS. 14A and 14B are demonstrative illustrations of a method of performing halo implantation in creating asymmetric field-effect-transistors according to embodiments of the invention. To generalize, the embodiment shown in FIG. 14A includes performing a halo implantation to transistor G5 at an angle θ3 from the right side thereof. Transistor G5 has a gate-mask stack of a total combined thickness (H1+H2+H3) that blocks and/or prevents halo implantation to transistor G6 being performed from the left side of G6 at a substantially same angle θ3. The embodiment shown in FIG. 14B includes performing a halo implantation to transistor G6 from the left side at an angle θ4 when the multilayer hard mask on top of gate conductor of transistor G5 is removed. Transistor G6 has a gate-mask stack of a total combined thickness (H1+H2) that blocks and/or prevents halo implantation to transistor G5 being performed from the right side of G5 at a substantially same angle θ4.

In general, different heights of gate-mask stacks of certain transistors may be used to enable and/or disable halo implantation performed to adjacent transistors at different implantation angles. The implantation angle may be determined by the total height of the gate-mask stack, and may be properly adjusted by adjusting the number of hard mask layers used on top of the gate conductors. The total combined heights of the gate-mask stack may be adjusted by selectively etching away one or more layers of the multilayer hard masks.

Figure 15:
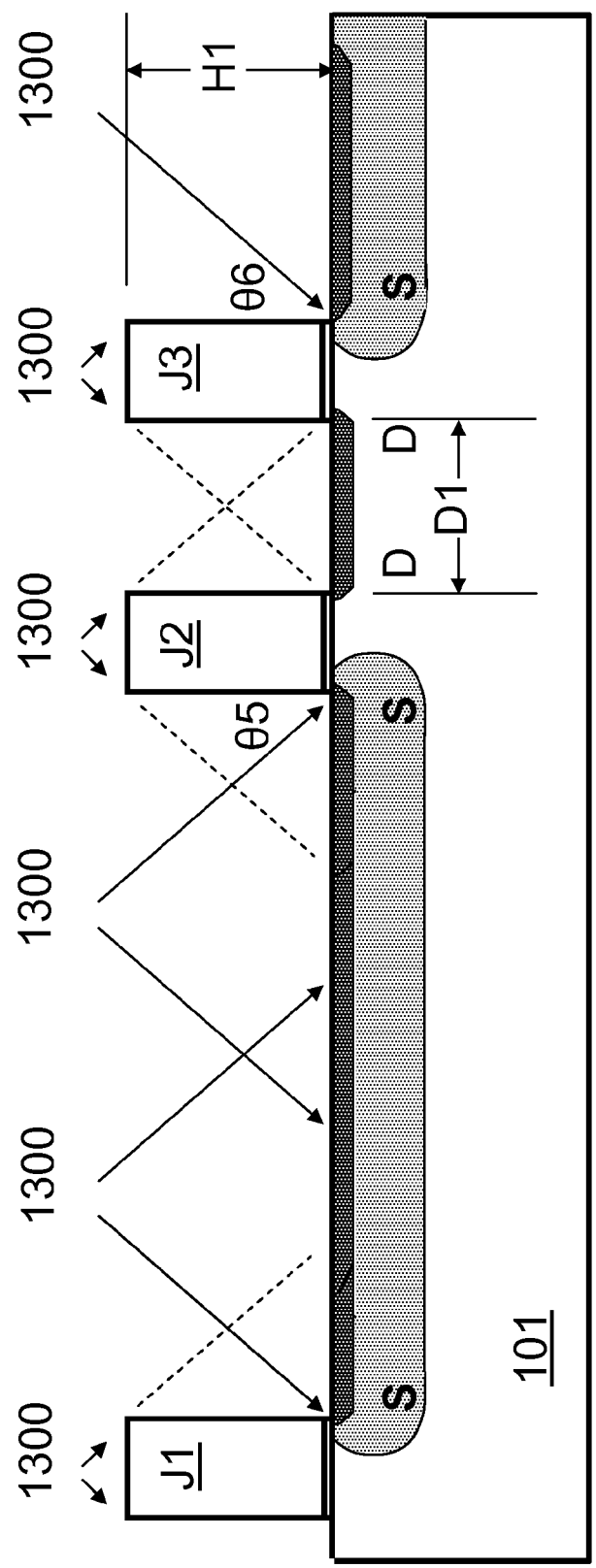
FIG. 15 is a demonstrative illustration of a method of performing halo implantation in creating asymmetrical field-effect-transistors according to another embodiment of the invention.

FIG. 15 is a demonstrative illustration of a method of performing halo implantation in creating asymmetrical field-effect-transistors according to another embodiment of the invention. For example, the invention may include forming gate conductors of height H1 of transistors J1, J2, and J3. In this instance, transistors J1, J2, and J3 may not be equally spaced. In FIG. 15, transistors J2 and J3 may be closely spaced and separated by a distance D1, but transistor J1 may be separated from transistor J2 by, for example, about 2 to 3 times the distance D1. During a subsequent halo implantation process 1300, gate conductor of transistor J2 may be used in preventing halo implantation in the drain region ("D") of transistor J3, to the left thereof, and gate conductor of transistor J3 may be used in preventing halo implantation in the drain region ("D") of transistor J2, to the right thereof. The implantation may be conducted at angles θ5 and θ6 that are substantially same and larger than arctangent (D1/H1). Here, as being mentioned before, angles θ5 and θ6 are measured against the normal to the substrate 101. In the meantime, because transistor J1 is separated from transistor J2 by about 2 to 3 times the distance D1, source region of transistor J1 (to the right thereof) and source region of transistor J2 (to the left thereof) may still experience proper halo implantation.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
    forming at least a first and a second gate-mask stack on top of a semiconductor substrate, wherein said first and second gate-mask stacks include at least, respectively, a first and a second gate conductor of a first and a second transistor and have, respectively, a top surface, a first side, and a second side with said second side being opposite to said first side;
    performing a first halo implantation from said first side of said first and second gate-mask stacks at a first angle while applying said first gate-mask stack in preventing said first halo implantation from reaching a first source/drain region of said second transistor, wherein said first angle is equal to or larger than a predetermined value; and
    performing a second halo implantation from said second side of said first and second gate-mask stacks at a second angle, thereby creating halo implant in a second source/drain region of said second transistor,
    wherein said first and second angles are measured against a normal to said substrate.

2. The method of claim 1, wherein said first and second gate-mask stacks are said first and second gate conductors, and said top surfaces of said first and second gate-mask stacks are top surfaces of said first and second gate conductors.

3. The method of claim 1, wherein said second angle is substantially same as said first angle.

4. The method of claim 1, wherein said second side of said first gate-mask stack and said first side of said second gate-mask stack are separated by a distance D1, said first gate-mask stack includes a first gate conductor of height H1 and a first hard-mask of height H2, and wherein said first and second angles have a value larger than arctangent of (D1/(H1+H2)).

5. The method of claim 4, wherein said first and second angles have a value between arctangent of (D1/(H1+H2)) and arctangent (D1/H1), further comprising creating halo implant in a second source/drain region of said first transistor during said second halo implantation.

6. The method of claim 5, wherein said second side of said first gate-mask stack and said first side of said second gate-mask stack are separated by approximately between 10 and 150 nm, and wherein said first and second angles are preferably between about 20 and 40 degrees.

7. The method of claim 1, comprising creating halo implant in a first source/drain region of said first transistor during said first halo implantation.

8. The method of claim 7, comprising applying said second gate-mask stack in preventing said second halo implantation from reaching a second source/drain region of said first transistor.

9. The method of claim 8, comprising forming a third, a fourth, and a fifth gate-mask stack to said first side of said first gate-mask stack with said fifth gate-mask stack being closest and said third gate-mask stack being farthest to said first gate-mask stack, and wherein said third, fourth, and fifth gate-mask stacks include a third, a fourth, and a fifth gate conductor respectively of a third, a fourth, and a fifth transistor, wherein said first halo implantation creates halo implant in a first source/drain region of said fifth transistor and said second halo implantation creates halo implant in a second source/drain region of said third and fourth transistors, and wherein said third gate-mask stack prevents said first halo implantation from reaching a first source/drain region of said fourth transistor and said first gate-mask stack prevents said second halo implantation from reaching a second source/drain region of said fifth transistor.

10. The method of claim 9, wherein said first, second, third, fourth, and fifth gate-mask stacks are substantially equally spaced, further comprising removing hard masks on top of said fourth and fifth gate conductors after forming said fourth and fifth gate-mask stacks.

11. The method of claim 9, where said third and fourth transistors are n-type field-effect-transistors serial connected providing a two-input NAND circuit, and said first and second transistors are n-type field-effect-transistors parallel connected providing a two-input NOR circuit.

12. The method of claim 1, wherein forming said first and second gate-mask stacks comprises forming a hard mask pattern on top of a gate conducting layer being deposited on top of said substrate, and transferring said hard mask pattern to said gate conducting layer through an etch process.

13. The method of claim 1, further comprising performing a shallow ion implantation from both said first and second sides of said second transistor, at an angle smaller than said predetermined value, to form source/drain extension regions of said second transistor.

14. The method of claim 1, wherein said second side of said first gate-mask stack and said first side of said second gate-mask stack are separated by a distance D1, said first gate-mask stack includes a first gate conductor of height H1 and a first hard-mask having a first layer of height H2 and a second layer of height H3, further comprising
  removing said second layer of said first hard-mask from said first gate-mask stack; and
  performing a third halo implantation from said first side of said first and second gate-mask stacks at a third angle, thereby creating halo implant in a first source/drain region of said second transistor,
  wherein said first and second angles have a value between arctangent of (D1/(H1+H2+H3)) and arctangent of (D1/(H1+H2)), and said third angle has a value between arctangent of (D1/(H1+H2)) and arctangent of (Dl/H1).

15. The method of claim 1, wherein said second side of said first gate-mask stack and said first side of said second gate-mask stack are separated by a distance D1, said second gate-mask stack includes a second gate conductor of height H1 and a second hard-mask having a first layer of height H2 and a second layer of height H3, further comprising
  removing said second layer of said second hard-mask from said second gate-mask stack; and
  performing a third halo implantation from said second side of said first and second gate-mask stacks at a third angle, thereby creating halo implant in a second source/drain region of said first transistor,
  wherein said first and second angles have a value between arctangent of (D1/(H1+H2+H3)) and arctangent of (D1/(H1+H2)), and said third angle has a value between arctangent of (D1/(H1+H2)) and arctangent of (D1/H1).

16. The method of claim 14, wherein said first and second layers of said first hard-mask are separated by an etch-stop layer, and removing said second layer of said first hard-mask comprises selectively etching said second layer of said first hard-mask which stops at said etch-stop layer.

17. The method of claim 1, wherein said first gate-mask stack includes a first gate conductor and a first hard-mask with said first hard-mask being self-aligned to said first gate conductor, and said second gate-mask stack includes a second gate conductor and a second hard-mask with said second hard-mask being self-aligned to said second gate conductor.

18. A method comprising:
  forming at least a first and a second gate-mask stack on top of a semiconductor substrate, wherein said first and second gate-mask stacks include, respectively, a first and a second gate conductor of a first and a second transistor and a first and a second multilayer hard masks on top of said first and second gate conductors, said first and second gate-mask stacks have a height H0 and are separated by a distance D1;
  removing a first layer of said multilayer hard mask of said second gate-mask stack, thereby said second gate-mask stack has a reduced height H1;
  performing a first halo implantation from a first side of said first and second gate-mask stacks at a first angle while applying said first gate-mask stack in preventing said first halo implantation from reaching a first source/drain region of said second transistor, wherein said first angle is between arctangent (D1/H0) and arctangent (D1/H1); and
  performing a second halo implantation from a second side of said first and second gate-mask stacks at a second angle, thereby creating halo implant in a second source/drain region of said first transistor, wherein said second angle is substantially same as said first angle,
  wherein said first and second angles are measured against a normal to said substrate.

19. The method of claim 18, further comprising:
  removing a first and a second layer of said multilayer hard mask of said first gate-mask stack, thereby said first gate-mask stack has a reduced height H2 that is smaller than H1;
  performing a third halo implantation from said first side of said first and second gate-mask stacks at a third angle, thereby creating halo implant in a first source/drain region of said second transistor, wherein said third angle is between arctangent (D1/H1) and arctangent (D1/H2); and
  performing a fourth halo implantation from said second side of said first and second gate-mask stacks at a fourth angle while applying said second gate-mask stack in preventing said fourth halo implantation from reaching a second source/drain region of said first transistor, wherein said fourth angle is substantially same as said third angle.

20. The method of claim 18, further comprising:
  removing a second layer of said multilayer hard mask of said second gate-mask stack, thereby said second gate-mask stack has a reduced height H2 that is smaller than H1;
  performing a third halo implantation from said second side of said first and second gate-mask stacks at a third angle, thereby creating another halo implant in said second source/drain region of said first transistor, wherein said third angle is between arctangent (D1/H1) and arctangent (D1/H2).

21. The method of claim 18, wherein said first and second multilayer hard masks comprise multiple hard mask layers that are separated by one or more etch-stop layers, and are self-aligned to their respective gate conductors underneath.

22. The method of claim 18, wherein removing said first layer of said multilayer hard mask of said second gate-mask stack comprises removing said first layer through a selective etching process.

23. The method of claim 18, wherein said first halo implantation creates one or more halo implanted source/drain regions of one or more transistors.

24. A method comprising:
    forming a plurality of gate-mask stacks on top of a semiconductor substrate;
    performing a first halo implantation from a first side of said plurality of gate-mask stacks at a first angle while applying at least a first gate-mask stack, corresponding to a first transistor, of said plurality of gate-mask stacks in preventing said first halo implantation from reaching a first source/drain region of a neighboring transistor next to said first transistor; and
    reducing a height of at least a second gate-mask stack, corresponding to a second transistor, of said plurality of gate-mask stacks to allow a second halo implantation reach a first source/drain region of a neighboring transistor next to said second transistor, said first source/drain region facing said second gate-mask stack and said second halo implantation being performed at a second angle larger than said first angle.

25. The method of claim 24, wherein said plurality of gate-mask stacks have substantially same height and are not equally spaced.

26. The method of claim 24, wherein said plurality of gate-mask stacks have different height and are equally spaced.

* * * * *